United States Patent
Zhao et al.

(10) Patent No.: US 9,676,619 B2
(45) Date of Patent: Jun. 13, 2017

(54) METHOD FOR WAFER-LEVEL CHIP SCALE PACKAGE TESTING

(71) Applicant: Memsic Semiconductor (Wuxi) Co., Ltd., Wuxi, Jiangsu (CN)

(72) Inventors: Yang Zhao, Andover, MA (US); Piu Francis Man, Andover, MA (US); Leyue Jiang, Wuxi (CN); Haidong Liu, Wuxi (CN); Bin Li, Andover, MA (US)

(73) Assignee: MEMSIC SEMICONDUCTOR (WUXI) CO., LTD., Wuxi (CN)

( * ) Notice: Subject to any disclaimer, the term of this patent is extended or adjusted under 35 U.S.C. 154(b) by 0 days.

(21) Appl. No.: 15/140,452

(22) Filed: Apr. 27, 2016

(65) Prior Publication Data
US 2017/0113929 A1 Apr. 27, 2017

(30) Foreign Application Priority Data

Oct. 21, 2015 (CN) .......................... 2015 1 0686666

(51) Int. Cl.
*H01L 21/66* (2006.01)
*B81C 1/00* (2006.01)
*H01L 21/78* (2006.01)
*H01L 21/683* (2006.01)
*H01L 23/31* (2006.01)
*B81C 99/00* (2010.01)

(52) U.S. Cl.
CPC ........ *B81C 1/00896* (2013.01); *B81C 99/004* (2013.01); *H01L 21/6836* (2013.01); *H01L 21/78* (2013.01); *H01L 22/20* (2013.01); *H01L 22/32* (2013.01); *H01L 23/3114* (2013.01); *H01L 2221/68327* (2013.01)

(58) Field of Classification Search
None
See application file for complete search history.

(56) References Cited

U.S. PATENT DOCUMENTS 6,025,732 A * 2/2000 Foo ...................... G01R 1/0483
324/750.05
2009/0057868 A1* 3/2009 Wang .................. B81C 1/00301
257/690

(Continued)

FOREIGN PATENT DOCUMENTS

KR 20140009605 A 1/2014

*Primary Examiner* — Reema Patel
(74) *Attorney, Agent, or Firm* — Han IP Corporation; Andy M. Han

(57) ABSTRACT

The present disclosure discloses a method for wafer-level chip scale packaged wafer testing. The method comprises: dicing a wafer-level chip scale packaged wafer into a plurality of wafer strips each comprising a plurality of un-diced chip scale packaged devices; fixing the wafer strips onto a plurality of corresponding strip carriers respectively; testing the chip scale packaged devices of the wafer strips fixed onto the strip carriers by a testing equipment; and dicing the tested wafer strips into a plurality of individual chip scale packaged devices. Since the proposed method does not involve loading a multitude of diced chips into sockets one by one, but that a limited number of wafer strips are loaded onto corresponding strip carriers, flow jam is avoided.

18 Claims, 7 Drawing Sheets

(a)  (b)

(56) References Cited

U.S. PATENT DOCUMENTS

| | | | |
|---|---|---|---|
| 2012/0013348 A1* | 1/2012 | Chen | G01R 1/0408 324/555 |
| 2012/0241955 A1* | 9/2012 | Law | H01L 24/81 257/738 |

* cited by examiner

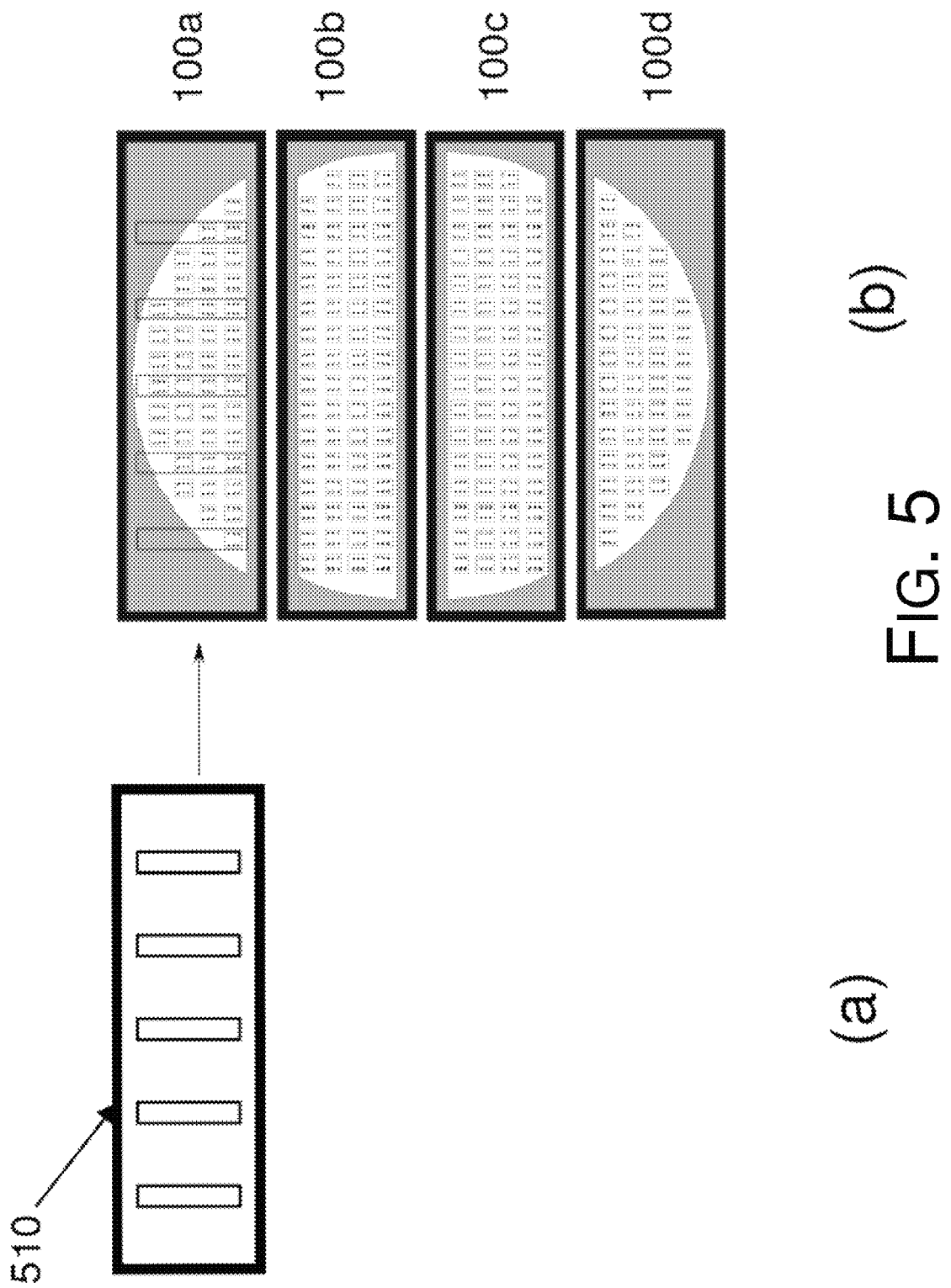

METHOD FOR WAFER-LEVEL CHIP SCALE PACKAGE TESTING

CROSS REFERENCE TO RELATED PATENT APPLICATION

The present disclosure claims the priority benefit of Chinese Patent Application No. 201510686666.1, filed on 21 Oct. 2015, which is incorporated by reference in its entirety.

TECHNICAL FIELD

The present disclosure relates to the field of package testing, and in particular, to a method for wafer-level chip scale package testing.

BACKGROUND

Wafer-level chip scale package (WLCSP for short) is commonly used in MEMS (micro-electro-mechanical-system) industry. Since the WLCSP does not require lead frame and wire bonding, its associated packaging cost becomes very attractive. Especially in the field of consumer electronics, MEMS-based WLCSP products will replace the traditionally packaged sensors. There is a need for high throughput and accurate final testing for MEMS wafer-level chip scale packaging products.

However, to achieve high throughput testing, packaged sensors are placed individually in either complex and expensive carriers or test socket boards and testing is performed in parallel. Handling individual packaged sensors by pick and place machine causes package jam and thus produces yield loss. Furthermore, positioning differences between packages lead to low repeatability and stimulus inaccuracy.

Therefore, there is a need to provide an improved method for wafer-level chip scale package testing to overcome the above mentioned problems.

SUMMARY

This section is for the purpose of summarizing some aspects of the present disclosure and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present disclosure.

One object of the present disclosure is to provide a method for wafer-level chip scale package testing to overcome the problem of flow jam in the prior art.

According to one aspect of the present disclosure, a method for wafer-level chip scale package testing provided in the present disclosure comprises: dicing a wafer-level chip scale packaged wafer into a plurality of wafer strips each comprising a plurality of un-diced chip scale packaged devices; fixing the wafer strips onto a plurality of corresponding strip carriers respectively; testing the chip scale packaged devices of the wafer strips fixed onto the strip carriers by a testing equipment; and dicing the tested wafer strips into a plurality of individual chip scale packaged devices.

One of the features, benefits and advantages in the present disclosure is to provide techniques for dicing an entire wafer-level chip scale packaged wafer into a plurality of wafer strips each comprising a plurality of un-diced chip scale packaged devices, and testing the chip scale packaged devices on the wafer strip by a testing equipment directly, thereby solving the problem of flow jam.

Other objects, features, and advantages of the present disclosure will become apparent upon examining the following detailed description of an embodiment thereof, taken in conjunction with the attached drawings.

BRIEF DESCRIPTION OF THE DRAWINGS

These and other features, aspects, and advantages of the present disclosure will become better understood with regard to the following description, appended claims, and accompanying drawings where:

FIG. 5 shows an example of a testing board of a testing equipment and an example in which the testing board is utilized to test a plurality of wafer strips.

DETAILED DESCRIPTION OF THE PREFERRED EMBODIMENTS

The detailed description of the present disclosure is presented largely in terms of procedures, steps, logic blocks, processing, or other symbolic representations that directly or indirectly resemble the operations of devices or systems contemplated in the present disclosure. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the present disclosure. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the present disclosure.

A traditional method for WLSCSP testing typically comprises: 1) dicing an entire wafer into a plurality of individual chips; 2) loading the individual chips onto carriers respectively; 3) testing the chips in parallel; and 4) loading the chips onto a tape and reel.

Figure 1:
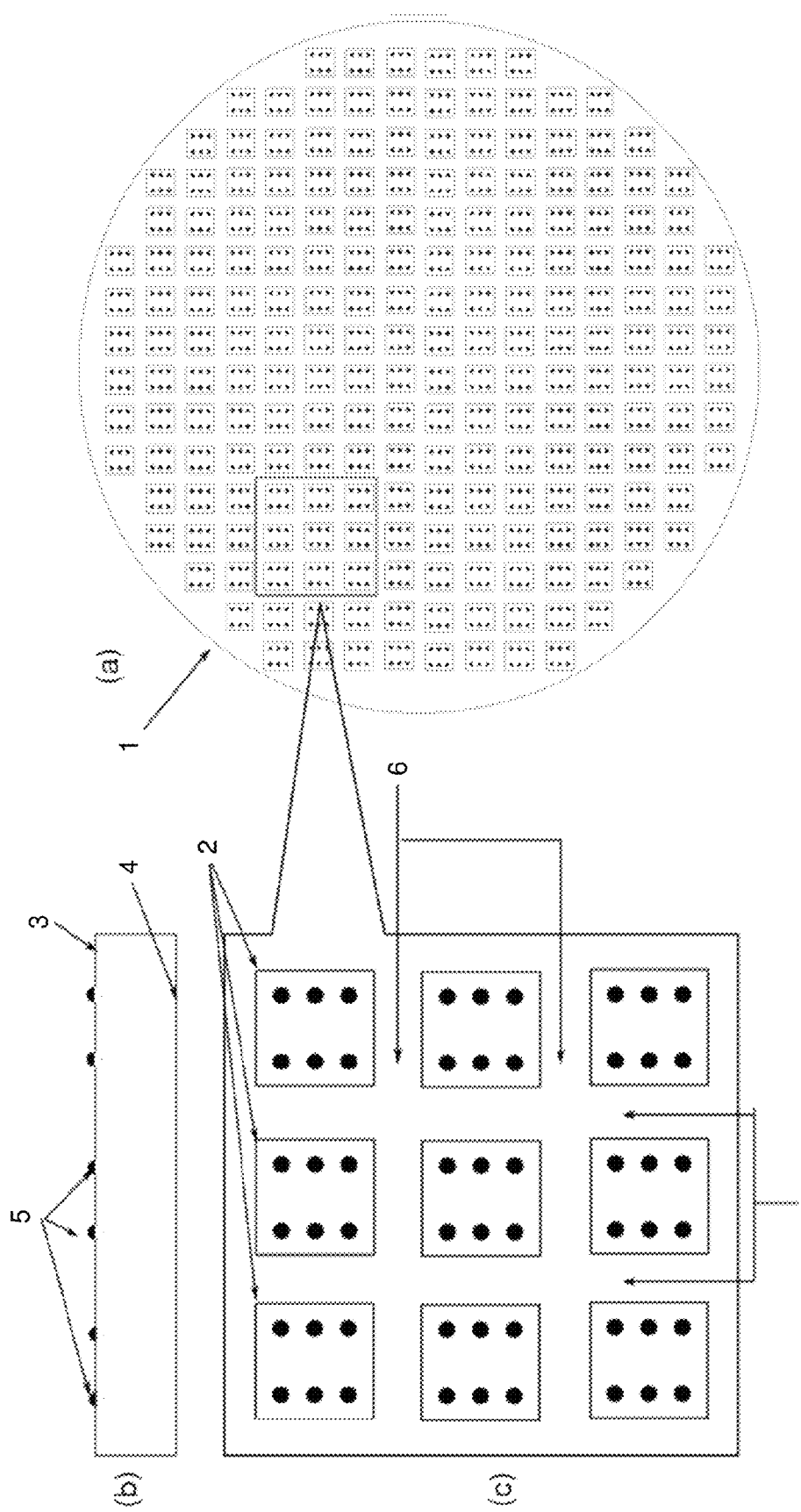
FIG. 1 shows a typical wafer comprising an array of sensor chips which are separated by dicing streets.

FIG. 1 shows a typical wafer 1 comprising a plurality of un-diced chip scale packaged devices 2. Referring to FIG. 1, each chip scale packaged device 2 has an upper surface 3 and a lower surface 4, and has a plurality of testing electrodes 5 on the upper surface 3. Each chip scale packaged device 2 is a chip. In some cases, the chip may be a MEMS chip, which may be used as a sensor, and thus may be also called a MEMS sensor. The chips 2 are separated by horizontal dicing streets 6 and vertical dicing streets 7. In the prior art, after the wafer 1 is diced, the chips, or chip scale packaged device 2, are loaded onto carriers which may be a testing circuit board comprising a plurality of testing sockets. To achieve high throughput testing, the sensors of chip scale packaged device 2 are tested in parallel. Handling individual chip scale packaged devices 2 by a pick and place machine causes package jam and thus results in yield loss.

Therefore, the present disclosure proposes a new efficient method for WLCSP to solve the problem of flow jam in the prior art.

Figure 2:
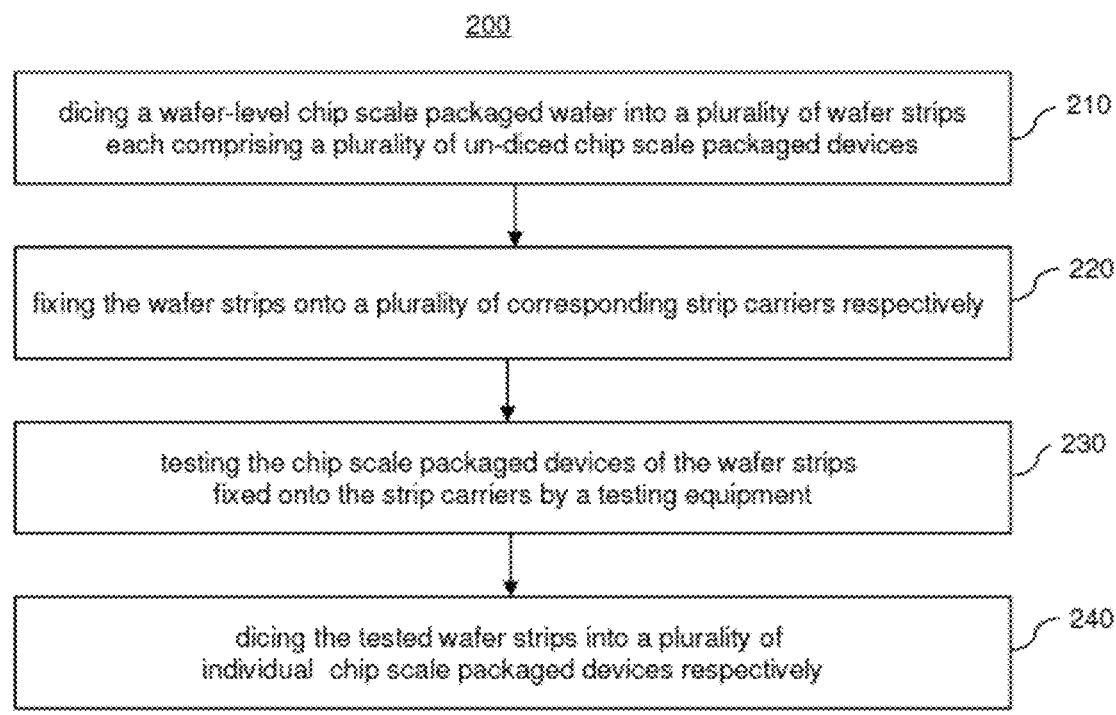
FIG. 2 shows a flow chart of a method for wafer-level chip scale package testing according to one embodiment of the present disclosure.

FIG. 2 shows a flow chart of a method 200 for wafer-level chip scale package testing according to one embodiment of the present disclosure. Referring to FIG. 2, the method 200 comprises following operations. Description of method 200 below is provided with reference to FIGS. 1, 3(*a*), 3(*b*), 4(*a*), 4(*b*), 5(*a*) and 5(*b*).

At 210, a wafer-level chip scale packaged wafer is diced into a plurality of wafer strips. Each of the wafer strips comprises a plurality of un-diced chip scale packaged devices.

Figure 3:
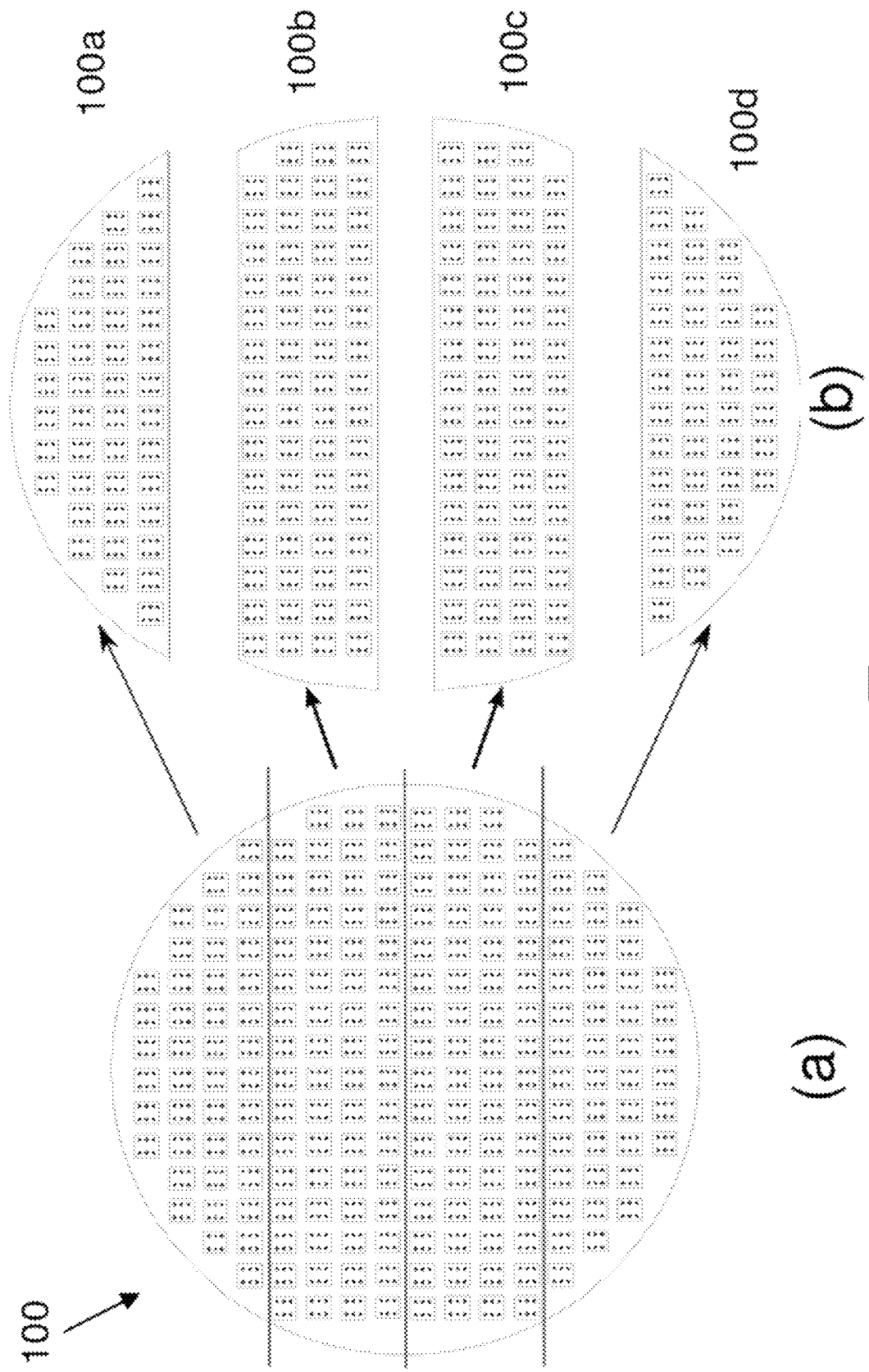
FIG. 3 shows an example in which an entire wafer is diced into a plurality of wafer strips.

As shown in FIG. 3(*a*), a wafer-level chip scale packaged wafer 100 is diced into four wafer strips, marked as 100*a*, 100*b*, 100*c* and 100*d* respectively, along three parallel horizontal dicing streets. In other embodiments, the wafer 100 may be also diced into other number of wafer strips, for example, two, three, five, six and so on, and may be alternatively diced along parallel vertical dicing streets. Of course, wafer 100 may be also diced along horizontal dicing streets and vertical dicing streets simultaneously, to obtain the wafer strips in fan-shape or other shapes. It should be noted that the wafer strips need not be in strip shape, and may be also in any other shapes.

Referring to FIG. 1, each wafer strip has an upper surface and a lower surface, and also comprises a plurality of un-diced chip scale packaged devices. Each of the chip scale packaged devices has a plurality of testing electrodes on the upper surface. The chip scale packaged device may be a MEMS chip or sensor, for example, an acceleration sensor, a magnetic field sensor, or the like.

A strip tag may be marked on each wafer strip. The strip tag can be used to determine to which wafer each wafer strip belongs and where each wafer strip is located on the wafer. The wafer is reconstructed based on the wafer strips with reference to the strip tag of the wafer strips.

At 220, the wafer strips are fixed onto corresponding strip carriers respectively.

Figure 4:
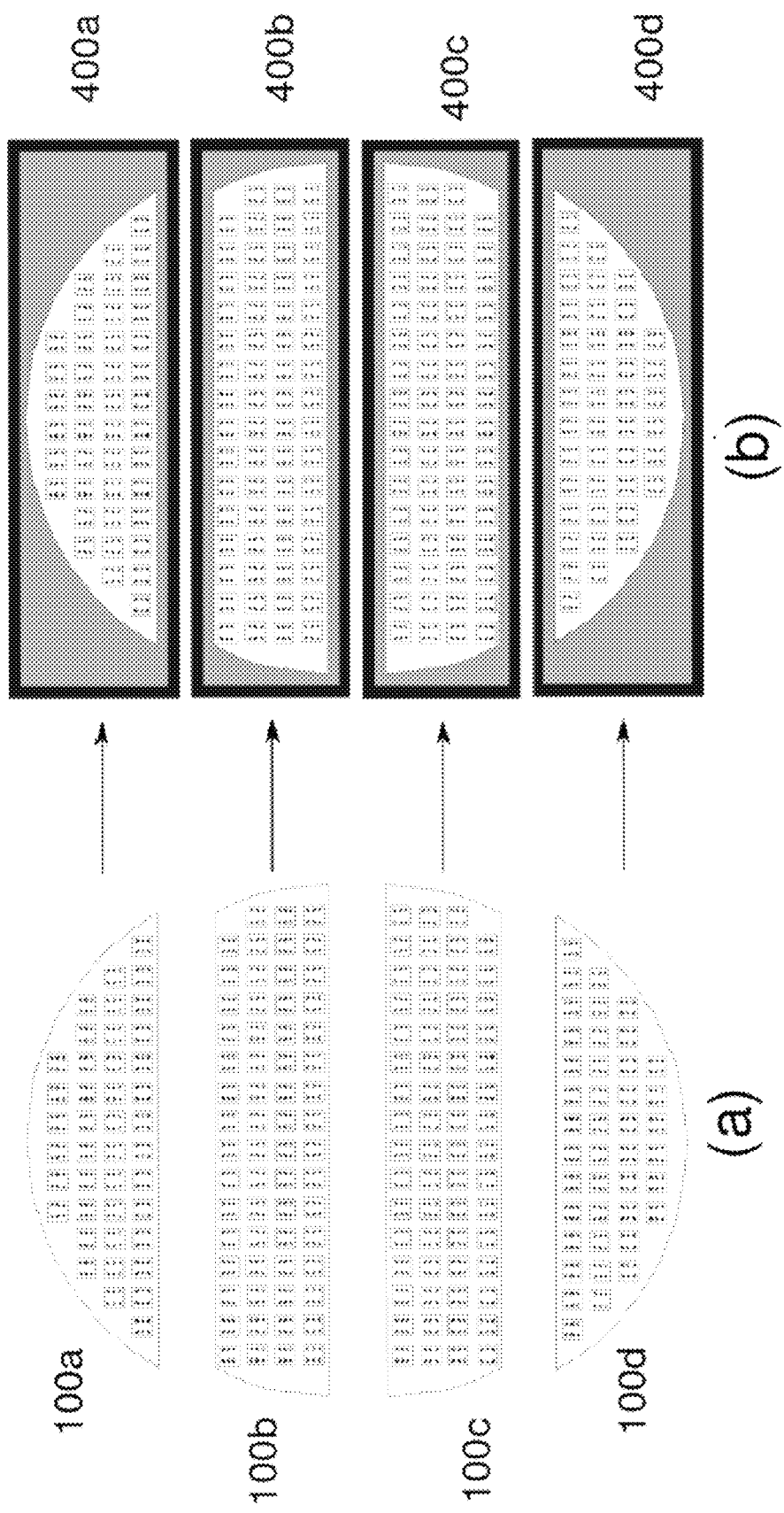
FIG. 4 shows an example in which a plurality of wafer strips are loaded in corresponding strip carriers.

FIG. 4(*a*) shows exemplarily four wafer strips 100*a*, 100*b*, 100*c* and 100*d*. FIG. 4(*b*) shows exemplarily four strip carriers 400*a*, 400*b*, 400*c* and 400*d* loading with corresponding wafer strips 100*a*, 100*b*, 100*c* and 100*d*.

Each strip carrier comprises a groove matching with a shape of corresponding wafer strip and receiving the corresponding wafer strip. Thus, each wafer strip may be fixed into the groove of corresponding strip carrier.

At 230, a testing equipment is utilized to test the chip scale packaged devices of the wafer strips fixed onto the strip carriers.

In one embodiment, the strip carriers with the wafer strips fixed thereon are placed into the testing equipment firstly, then the testing equipment is used to perform a large scale electrical test on the chip scale packaged devices on the wafer strip. After the test is finished, the strip carriers with the wafer strips fixed thereon are taken out of the testing equipment.

The testing equipment may be a conventional testing equipment, and there is not a special requirement or design to the testing equipment in the present disclosure. Likewise, the testing equipment may also utilize a conventional testing scheme to perform the large scale electrical test to the chip scale packaged devices on the wafer strips.

As shown in FIG. 5(*a*), an example testing board 510 of the testing equipment has a plurality of testing probe cards. In testing, as shown in FIG. 5(*b*), the plurality of testing probe cards on the testing board 510 may be aligned with and electrically contact the testing electrodes of the chip scale packaged devices to perform the electrical test.

At 240, the tested wafer strips are diced into a plurality of individual chip scale packaged devices respectively.

In a first embodiment, dicing the tested wafer strips into a plurality of individual chip scale packaged devices at 240 may comprise the following operations A1, A2 and A3:

A1) The tested wafer strips are removed from the corresponding strip carriers.

A2) The tested wafer strips are attached onto individual blue tapes respectively.

A3) The wafer strips attached onto the blue tapes are diced separately into individual chip scale packaged devices.

In the first embodiment, different wafer strips are diced separately. However, the above-mentioned way of dicing each wafer strip separately to obtain the individual chip scale packaged devices tend to increase the cost of dicing.

In a second embodiment, dicing the tested wafer strips into a plurality of individual chip scale packaged devices at 240 may comprise following operations B1, B2, B3, and B4. Description of operations B1, B2, B3 and B4 below is provided with reference to FIGS. 6*a*, 6*b*, 7*a*, 7*b*, 7*c* and 7*d*.

B1) The tested wafer strips are removed from the corresponding strip carriers, and the wafer strips belonging to a wafer are loaded into a dicing fixture.

Figure 6A:
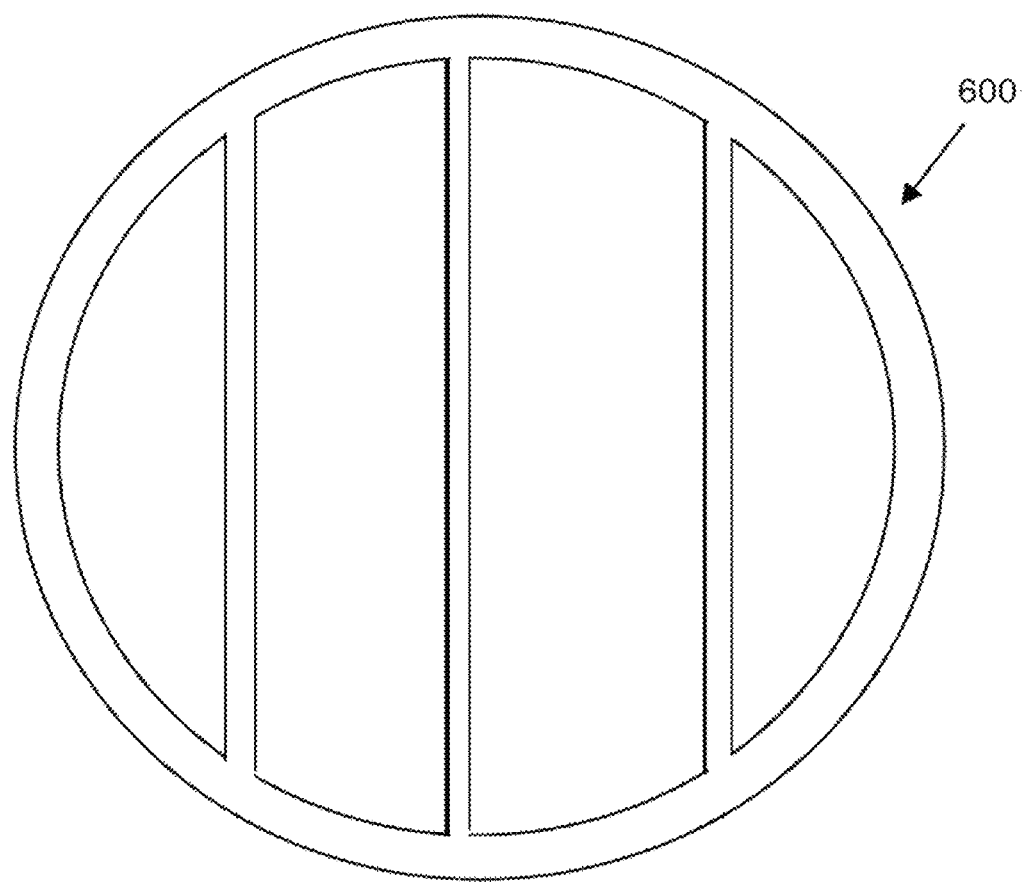
FIG. 6a is a schematic top view showing a dicing fixture provided in the present disclosure.
Figure 6B:
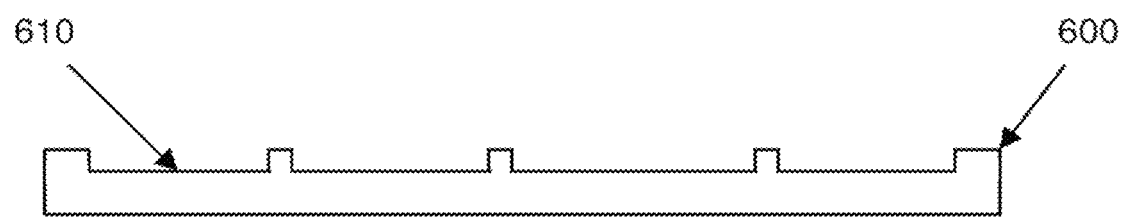
FIG. 6b is a schematic cross section view showing the dicing fixture provided in the present disclosure.

FIG. 6*a* is a schematic top view showing a dicing fixture 600 provided in the present disclosure. FIG. 6*b* is a schematic cross section view showing the dicing fixture 600 provided in the present disclosure. As shown in FIGS. 6*a* and 6*b*, the dicing fixture 600 may comprise a plurality of grooves 610, and there are four grooves shown in the example. Each groove corresponds to one of the wafer strips obtained by dicing an entire wafer, and each groove matches with a corresponding wafer strip in shape mutually and has a suitable tolerance, such that each groove 610 can accommodate a corresponding wafer strip. When each wafer strip is loaded into the dicing fixture 600, the upper surface of the wafer strip faces the groove 610.

In one embodiment, the dicing fixture 600 may be made from a wafer, such as a silicon wafer, a glass wafer, a fused quartz wafer or a quartz wafer. The size of the dicing fixture 600 may be larger than that of the wafer to be diced into the wafer strips. For example, for the wafer strips produced by dicing a 6-inch wafer, the dicing fixture 600 may be produced by an 8-inch wafer. The production process of the dicing fixture may be a standard photolithographic process and employ wet or dry etching, and the relevant processes have been widely applied. For example, the production process of the dicing fixture 600 may comprise: coating a photoresist layer on an 8-inch silicon wafer; baking at a low temperature; exposing and developing to form a pattern of wafer strips; dry etching or wet etching the silicon wafer such as by SF6 silicon etching process to form the grooves, and removing the residual photoresist.

Figure 7A:
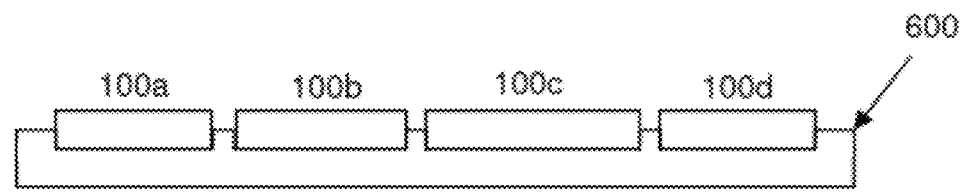
FIGS. 7a-7d show a process of dicing the wafer strips.

FIG. 7a shows schematically a state in which the wafer strips 100a, 100b, 100c and 100d in FIG. 3a are fixed into corresponding grooves 610 of the dicing fixture 600 respectively.

Figure 7B:
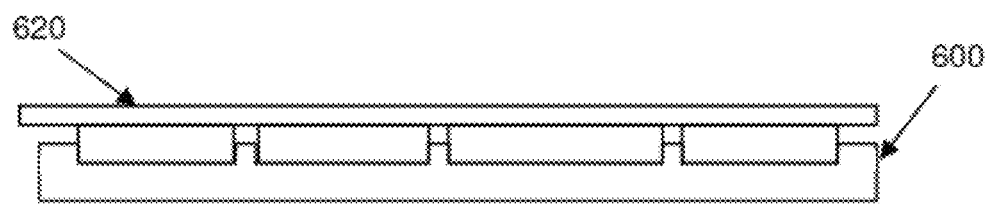

B2) A blue tape 620 is affixed on lower surfaces of the wafer strips of the wafer, such that the wafer strips reconstitute an entire wafer again, as shown in FIG. 7b.

Figure 7C:
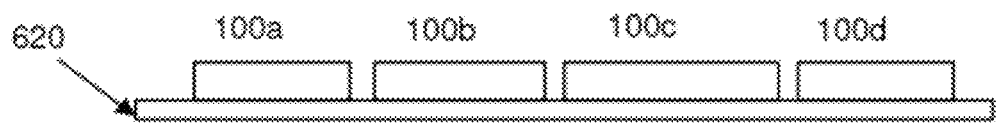

B3) The dicing fixture 600 is removed, as shown in FIG. 7c.

Figure 7D:

B4) The reconstituted entire wafer is diced integrally to obtain the individual chip scale packaged devices, as shown in FIG. 7d.

In this embodiment, the dicing fixture 600 is used to reconstitute the wafer strips into the entire wafer again and then the reconstituted entire wafer is diced integrally, thus decreasing the cost of dicing.

In one embodiment, the entire wafer is firstly diced into the wafer strips, and then the wafer strips are fixed onto the strip carriers. Since this does not involve loading a multitude of diced chips into sockets one by one, but that a limited number of wafer strips are placed into strip carriers, flow jam can be avoided.

Finally, after the individual separated chip scale packaged devices are obtained, they may be loaded onto a tape and reel.

In the prior art, there are a positioning difference between the chip scale packaged devices after the chip scale packaged devices are loaded into sockets separately. Such a positioning difference will not affect the test of the chip scale packaged devices seriously. As long as the positioning difference is not large and the testing probes are able to contact normally the testing electrodes of the chip scale packaged devices, the test can accomplish successfully. However, for the test of a MEMS device, such as an acceleration sensor and a magnetic field sensor, an external stimulus with a certain direction or angle such as a magnetic field with a certain direction needs to be applied, and the influence produced by such a positioning difference between the chip scale packaged devices is very serious and will lead to poor repeatability and inaccuracy test.

Therefore, in a preferred embodiment, the method is proposed in the present disclosure to achieve high repeatability, high test accuracy and low cost.

In the preferred embodiment, after the wafer strips are fixed onto corresponding strip carriers respectively at 220, and before the testing equipment is utilized to test the individual chip scale packaged devices of the wafer strips fixed onto the strip carriers at 230, the method 200 may further comprise following operations:

1) An external stimulus, for example, a magnetic field in a certain direction is applied;

2) A response of a reference sensor on the strip carrier is detected, wherein the reference sensor is disposed on the strip carrier; and 3) A position of the strip carrier is adjusted based on the response of the reference sensor to accomplish a positioning calibration of the strip carrier relative to the external stimulus.

Since the relative position between un-diced chips in the wafer strip is fixed, and the wafer strip is fixed relative to the strip carrier, the positional calibration may be performed on all the chips together with the strip carrier, thereby avoiding alignment error. This improves the accuracy and the reliability of the response to the external stimulus. As compared to a mechanical method for aligning the chips, especially micro-sized chips in the prior art, the method of the present disclosure is more accurate and saves effort.

The present disclosure has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the present disclosure as claimed. Accordingly, the scope of the present disclosure is defined by the appended claims rather than the foregoing description of embodiments.

What is claimed is:

1. A method for wafer-level chip scale package testing, comprising:
   dicing a wafer-level chip scale packaged wafer into a plurality of wafer strips each comprising a plurality of un-diced chip scale packaged devices;
   fixing the wafer strips onto a plurality of corresponding strip carriers respectively;
   applying an external stimulus;
   for each strip carrier, detecting a response of a reference sensor disposed on the strip carrier;
   for each strip carrier, adjusting a position of the strip carrier based on the response of the reference sensor to accomplish a positional calibration of the strip carrier relative to the external stimulus;
   testing the chip scale packaged devices of the wafer strips fixed onto the strip carriers by a testing equipment; and
   dicing the tested wafer strips into a plurality of individual chip scale packaged devices.

2. The method according to claim 1, wherein each wafer strip has an upper surface and a lower surface, wherein each chip scale packaged device has a plurality of testing electrodes located on the upper surface, and wherein a plurality of probes of a probe card installed in the testing equipment electrically contact the testing electrodes to test the chip scale packaged devices of the wafer strips fixed onto the strip carriers.

3. The method according to claim 1, wherein each strip carrier comprises a groove matching with a shape of a corresponding wafer strip of the plurality of wafer strips and receiving the corresponding wafer strip.

4. The method according to claim 1, wherein the dicing of the tested wafer strips into a plurality of individual chip scale packaged devices comprises:
   attaching the tested wafer strips onto individual blue tapes respectively; and
   dicing the wafer strips attached onto the individual blue tapes separately to obtain the individual chip scale packaged devices.

5. The method according to claim 1, wherein the dicing of the tested wafer strips into a plurality of individual chip scale packaged devices comprises:
   loading the tested wafer strips belonging to a wafer into a dicing fixture having a plurality of grooves matching with shapes of the tested wafer strips respectively, wherein upper surfaces of the test wafer strips face the grooves of the dicing fixture;
   affixing a blue tape on lower surfaces of the tested wafer strips loaded into the dicing fixture such that the tested wafer strips reconstitute an entire wafer;
   removing the dicing fixture; and
   dicing the reconstituted wafer to obtain the individual chip scale packaged devices.

6. The method according to claim 5, wherein the dicing fixture comprises a wafer.

7. The method according to claim 5, wherein the dicing fixture comprises a silicon wafer, a glass wafer, a fused quartz wafer or a quartz wafer, and wherein a size of the wafer that makes the dicing fixture is larger than that of the wafer which is diced into the plurality of wafer strips.

8. The method according to claim 1, wherein the wafer-level chip scale packaged wafer is diced into the plurality of wafer strips along one or more parallel horizontal dicing streets or parallel vertical dicing streets.

9. The method according to claim 1, wherein at least one of the chip scale packaged devices comprises a micro-electro-mechanical-system (MEMS) sensor.

10. The method according to claim 9, wherein the MEMS sensor is an acceleration sensor or a magnetic field sensor.

11. A method for wafer-level chip scale package testing, comprising:
dicing a wafer-level chip scale packaged wafer into a plurality of wafer strips each comprising a plurality of un-diced chip scale packaged devices;
fixing the wafer strips onto a plurality of corresponding strip carriers respectively;
testing the chip scale packaged devices of the wafer strips fixed onto the strip carriers by a testing equipment; and
dicing the tested wafer strips into a plurality of individual chip scale packaged devices,
wherein the dicing of the tested wafer strips into a plurality of individual chip scale packaged devices comprises:
loading the tested wafer strips belonging to a wafer into a dicing fixture having a plurality of grooves matching with shapes of the tested wafer strips respectively, wherein upper surfaces of the test wafer strips face the grooves of the dicing fixture;
affixing a blue tape on lower surfaces of the tested wafer strips loaded into the dicing fixture such that the tested wafer strips reconstitute an entire wafer;
removing the dicing fixture; and
dicing the reconstituted wafer to obtain the individual chip scale packaged devices.

12. The method according to claim 11, wherein each wafer strip has an upper surface and a lower surface, wherein each chip scale packaged device has a plurality of testing electrodes located on the upper surface, and wherein a plurality of probes of a probe card installed in the testing equipment electrically contact the testing electrodes to test the chip scale packaged devices of the wafer strips fixed onto the strip carriers.

13. The method according to claim 11, wherein each strip carrier comprises a groove matching with a shape of a corresponding wafer strip of the plurality of wafer strips and receiving the corresponding wafer strip.

14. The method according to claim 11, wherein the dicing fixture comprises a wafer.

15. The method according to claim 11, wherein the dicing fixture comprises a silicon wafer, a glass wafer, a fused quartz wafer or a quartz wafer, and wherein a size of the wafer that makes the dicing fixture is larger than that of the wafer which is diced into the plurality of wafer strips.

16. The method according to claim 11, wherein the wafer-level chip scale packaged wafer is diced into the plurality of wafer strips along one or more parallel horizontal dicing streets or parallel vertical dicing streets.

17. The method according to claim 11, wherein at least one of the chip scale packaged devices comprises a micro-electro-mechanical-system (MEMS) sensor.

18. The method according to claim 17, wherein the MEMS sensor is an acceleration sensor or a magnetic field sensor.

* * * * *